US010026734B2

(12) United States Patent
Toner et al.

(10) Patent No.: US 10,026,734 B2
(45) Date of Patent: Jul. 17, 2018

(54) MOS DEVICE ASSEMBLY

(75) Inventors: Brendan Toner, Dungiven (IE); Tsui Ping Chu, Kuching (CN); Foo Sen Liew, Kuching (MY)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 570 days.

(21) Appl. No.: 14/358,067

(22) PCT Filed: Nov. 15, 2011

(86) PCT No.: PCT/EP2011/070176
§ 371 (c)(1),
(2), (4) Date: Aug. 19, 2014

(87) PCT Pub. No.: WO2013/071959
PCT Pub. Date: May 23, 2013

(65) Prior Publication Data
US 2014/0367796 A1   Dec. 18, 2014

(51) Int. Cl.
| H01L 27/088 | (2006.01) |
| H01L 21/8234 | (2006.01) |
| H01L 27/02 | (2006.01) |
| H03F 1/32 | (2006.01) |
| H01L 21/02 | (2006.01) |
| H01L 21/28 | (2006.01) |
| H01L 29/08 | (2006.01) |
| H01L 29/423 | (2006.01) |
| H01L 29/49 | (2006.01) |
| H01L 29/51 | (2006.01) |

(52) U.S. Cl.
CPC ...... *H01L 27/088* (2013.01); *H01L 21/02068* (2013.01); *H01L 21/02238* (2013.01); *H01L 21/28035* (2013.01); *H01L 21/823425* (2013.01); *H01L 21/823456* (2013.01); *H01L 27/0207* (2013.01); *H01L 29/0847* (2013.01); *H01L 29/42364* (2013.01); *H01L 29/42376* (2013.01); *H01L 29/4916* (2013.01); *H01L 29/51* (2013.01); *H03F 1/3205* (2013.01); *H01L 21/823462* (2013.01)

(58) Field of Classification Search
CPC ..................................................... H01L 27/088
USPC ........................................................ 257/392
See application file for complete search history.

(56) References Cited

U.S. PATENT DOCUMENTS

| 3,430,112 A | 2/1969 | Hilbourne |
| 4,395,725 A | 7/1983 | Parekh |

(Continued)

FOREIGN PATENT DOCUMENTS

JP   2008277690 A   11/2008

OTHER PUBLICATIONS

International Search Report and Written Opinion dated Jun. 27, 2012 re: PCT/EP2011/070176; pp. 4.

(Continued)

*Primary Examiner* — Hsin-Yi Hsieh
(74) *Attorney, Agent, or Firm* — Nixon & Vanderhye PC

(57) ABSTRACT

A MOS device assembly having at least two transistors, each transistor having a gate region. The dimensions of the gate region of the first transistor are different from the dimensions of the gate region of the second transistor. The transconductance of the MOS device assembly is substantially uniform when the gate regions of the first and second transistors are biased using the same voltage.

31 Claims, 6 Drawing Sheets

(56) References Cited

U.S. PATENT DOCUMENTS

| | | | |
|---|---|---|---|
| 5,777,518 | A | 7/1998 | Bailey |
| 6,819,184 | B2 | 11/2004 | Pengelly et al. |
| 7,629,627 | B2 | 12/2009 | Mil'shtein et al. |
| 2002/0047140 | A1 | 4/2002 | Moller et al. |
| 2007/0044024 | A1 | 2/2007 | Na et al. |
| 2007/0287404 | A1 | 12/2007 | Arnborg |
| 2008/0006875 | A1* | 1/2008 | Ohtsuka .............. H01L 27/0629 257/341 |

OTHER PUBLICATIONS

Tae Hwan Jin et al. "A 6.75 mW $+$ 12.45 dBm IIP3 1.76 dB NF 0.9 GHz CMOS LNA Employing Multiple Gated Transistors With Bulk-Bias Control", IEEE Microwave and Wireless Components Letters, IEEE Service Center, Nov. 9, 2011, pp. 616-618, vol. 21, No. 11 New York, US.

Raymond S. Pengelly, "Improving the Linearity and Efficiency of RF Power Amplifiers," High Frequency Electronics, Sep. 2002, pp. 26-34.

Edgar Sánchez-Sinencio, "Linearization Techniques for CMOS LNAs: A Tutorial," Analog and Mixed Signal Center, Texas A&M University, retrieved Feb. 17, 2017, 76 pages.

* cited by examiner

MOS DEVICE ASSEMBLY

FIELD

The disclosure relates to a MOS device assembly. Embodiments of the disclosure provide a MOS device assembly having substantially uniform transconductance characteristics.

BACKGROUND

The MOS transistor transconductance (gm) is a useful figure of merit in analogue circuit design. The ratio gm/Id (Id being the drain current of the transistor), sometimes referred to as its transconductance generation efficiency, is also sometimes of interest. FIG. 1 illustrates the tranconductance characteristics (gm) 150 as a function of a range of gate voltages Vg for a transistor. These are basic transistor characteristics for measuring the transconductance performance. The problem of these characteristics is that they provide very limited flexibility when applied for a given technology. The circuit designer must accept these characteristics as they are and needs to rely on circuit design techniques only to try to achieve the best circuit performance.

It is an aim of certain embodiments of the present disclosure to provide a transistor arrangement that has an improved transconductance characteristic for analogue design. In certain embodiments this results in a gm (quasi) plateau.

One of the circuit design techniques to influence the transconductance of a transistor is to vary the gate length and width of the transistor. It is noted that changing one aspect, the width, of a transistor has no impact on the ratio gm/Id. This is because both the transconductance and the drain current can scale with the width of the transistor. The second order figure of merit, i.e. the ratio gm/Id, can be relevant in applications such as amplifier design, in which the gain of the amplifier is related to the operating point of transistors of the amplifier. This figure of merit allows basic design decisions for power consumption, gain, bandwidth and transistor size to be made.

Altering the gate length of a transistor has a strong impact on the transconductance and the threshold voltage. For example, simply varying the gate length may result in one transistor having a significantly higher transconductance than other associated transistors in the circuit. As such, this can have an undesirable effect on the gm peaks of other associated transistors and therefore not result in a gm plateau.

Various transistor arrangements have been previously demonstrated in which the transconductance of the MOS transistors is varied to improve analogue performance. For example, it has been demonstrated to alter the transconductance characteristics of a transistor arrangement by varying the gate length to width ratios and differential biasing of each transistor of the transistor arrangement. The main objective of this arrangement is to reduce the third order intermodulation characteristics and therefore to make the transistors more linear. In a different arrangement, it has been demonstrated to bias differentially each gate of at least two gates of a transistor to achieve a constant transconductance performance. Improvement in transconductance performance is also achieved in a further arrangement in which field effect transistors are paired and biased using differential biasing to achieve the uniform transconductance. In these known arrangements, the transconductance has been modified from a device/circuit design perspective only. Furthermore, the DC biasing for each transistor has to be isolated from the other transistors, which requires using extra primitive devices to act as DC blocks. This adds complexity to the transistor arrangement and also adds to chip area. The reader is referred to U.S. Pat. No. 6,819,184, U.S. Pat. No. 7,629,627 and U.S. Pat. No. 5,777,518.

SUMMARY

According to one aspect of the present disclosure, there is provided a MOS device assembly comprising:
  at least a first transistor and a second transistor, each having a gate and a gate region;
  wherein the dimensions of the gate or gate region of the first transistor are different from the dimensions of the gate or gate region of the second transistor; and
  the transconductance of the MOS device assembly is substantially uniform when the gates or gate regions of the first and second transistors are biased using the same voltage.

According to a further aspect of the present disclosure there is provided a MOS device assembly comprising:
  at least a first transistor and a second transistor, each having a gate and a gate region;
  wherein the dimensions of the gate or gate region of the first transistor are different from the dimensions of the gate or gate region of the second transistor; and
  the transconductance of the MOS device assembly is substantially uniform over a gate voltage range of at least 0.7 V when the gates or gate regions of the first and second transistors are biased using the same voltage.

According to a further aspect of the present disclosure there is provided a MOS device assembly comprising:
  at least a first transistor and a second transistor, each having a gate and a gate region;
  wherein the dimensions of the gate or gate region of the first transistor are different from the dimensions of the gate or gate region of the second transistor, such that, when the gates or gate regions of the first and second transistors are biased using the same voltage, the uniformity of the transconductance of the MOS device assembly over a predetermined range of gate voltages is improved when compared with the transconductance of the first transistor or the second transistor of the MOS device assembly over said range of gate voltages.

According to a further aspect of the present disclosure there is provided a method of manufacturing a MOS device assembly comprising at least a first transistor and a second transistor, the method comprising:
  forming a gate and a gate region of the first transistor, and forming a gate and a gate region of the second transistor, wherein the dimensions of the gate or gate region of the first transistor are different from the dimensions of the gate or gate region of the second transistor, and the transconductance of the MOS device assembly is substantially uniform when the gate or gate regions of the first and second transistors are biased using the same voltage.

The dimensions of the gate or gate region of each transistor are chosen such that the tranconductance of the MOS device assembly is substantially uniform. This disclosure may therefore improve the transconductance characteristic of the MOS device assembly by varying the process parameters of each transistor rather than relying on the circuit design techniques as shown in the prior art. The process level variation is combined with an improved layout harnessing the behavioural changes of the device over different dimensions with the aim of achieving a substantially uniform transconductance characteristic of the MOS device assembly. One embodiment of the disclosure provides a composite transistor having four MOS transistors of varied oxide thicknesses, gate lengths, gate widths and threshold voltages but using only a single poly gate.

BRIEF DESCRIPTION OF THE FIGURES

Some embodiments will now be described by way of example only and with reference to the accompanying drawings, in which.

DETAILED DESCRIPTION OF THE FIGURES

Embodiments of the present disclosure provide a single MOS device assembly or a single composite transistor having at least two transistors. In one embodiment, the composite transistor comprises four transistors with different gate lengths, widths, oxide thicknesses and threshold voltages, which are conjoined at all of the transistor terminals—drain, gate, source and bulk. This composite transistor has a plurality of transconductance peaks over a range of gate voltages. The sum of these transconductance peaks results in a quasi-plateau over these gate voltages.

Figure 1:
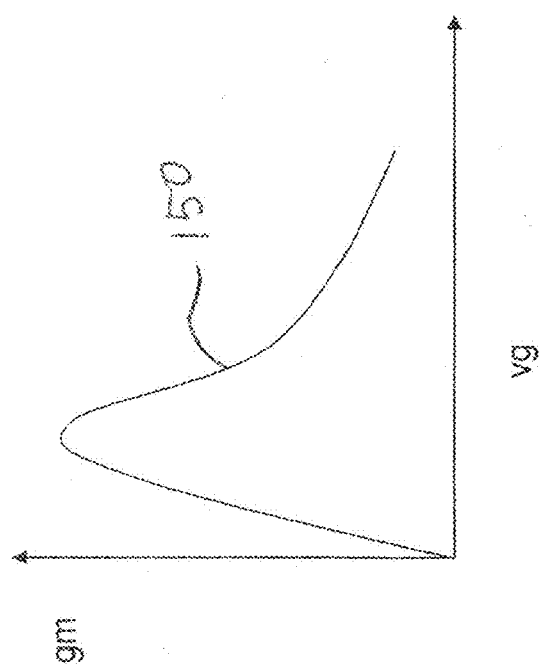
FIG. 1 illustrates the tranconductance characteristics (gm) of a transistor as a function of a range of gate voltages.
Figure 2:
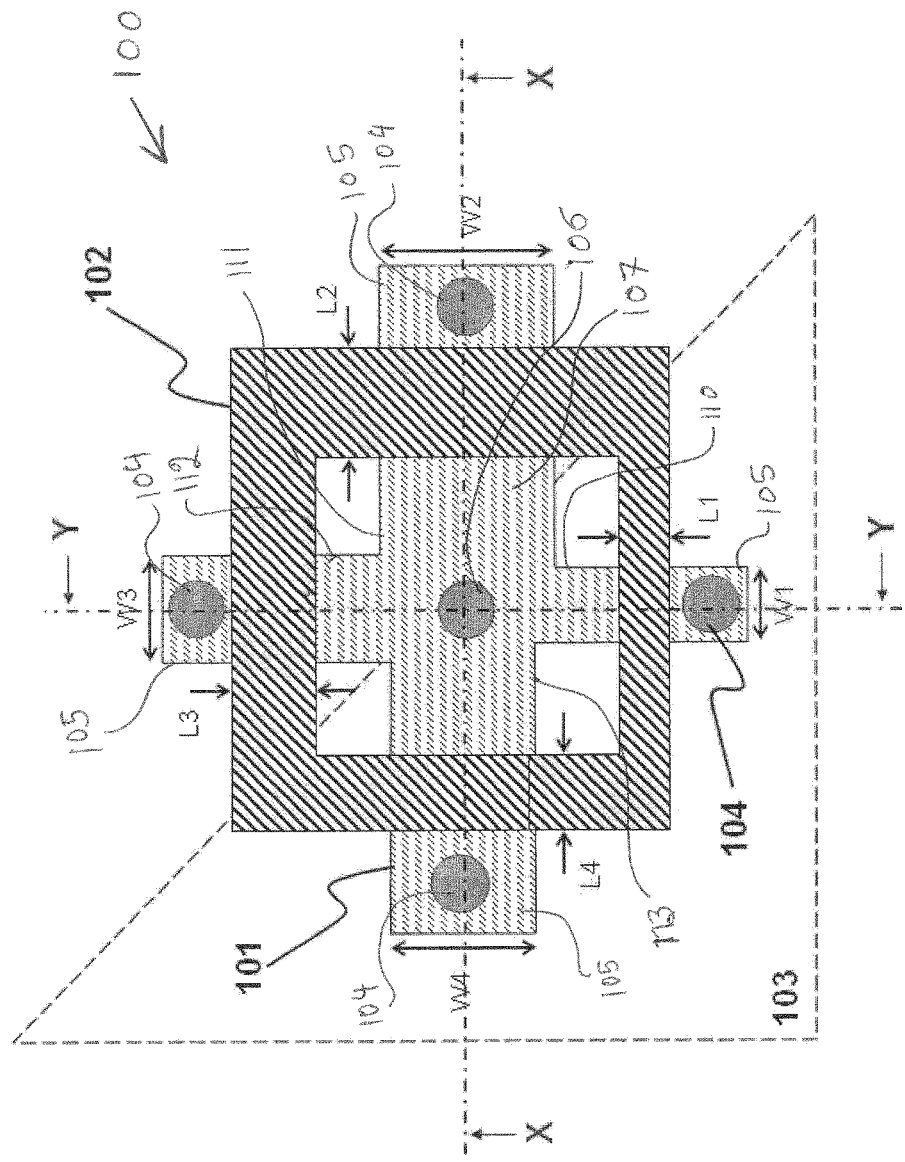
FIG. 2 is a schematic plan view of a MOS device assembly according to an embodiment of the present disclosure.

FIG. 2 is a schematic plan view of a MOS device assembly 100. The device assembly 100 comprises four MOS transistors: a first transistor 110, a second transistor 111, a third transistor 112 and a fourth transistor 113. The first transistor 110 and the third transistor 112 are aligned opposite each other, and the second transistor 111 and the fourth transistor 113 are aligned and opposite each other. The device assembly 100 includes an active region 101. In this example, the active region 101 has a "cross" shape. The active region 101 includes a source region 107 having a source contact 106, which is common between all the transistors. The active region 101 also includes a separate drain region 105 having a drain contact 104 for each transistor. Each transistor includes a gate oxide region over the active region 101 between the source and drain regions 107, 105. In the arrangement of FIG. 2, two gate oxide regions can be defined: a first gate oxide region, which is defined by a triangular mask 103, and a second gate oxide region (not shown), in the area not covered by mask 103. The first gate oxide region acts as the gate oxide regions for the first and fourth transistors 110, 113, and both have an oxide thickness D1. The second oxide region acts as the gate oxide region of the second and third transistors 111, 112, and both have a thickness D2 which is different from the oxide thickness D1 of the first and fourth transistors 110, 113. Each transistor of the device assembly 100 includes a poly gate which is located on top of the gate oxide region of each transistor. The device assembly 100 includes a common poly gate structure 102, and the poly gate of each transistor forms part of the common gate structure 102. In this example, the common gate structure 102 has a rectangular shape and is biased using the same DC voltage. The intersection of the generally ring-shaped gate structure 102 with each arm of the generally cross-shaped active region 101 approximately defines the gate regions of the transistors, and this is where the gate of each transistor is located. The common gate structure 102 is shaped such that the lengths L1-L4 and the widths W1-W4 of the poly gate of each transistor are different. As the lengths L1-L4 and the widths W1-W4 of the poly gate and the thicknesses of the oxide region of each transistor are different, the threshold voltage of each transistor is different.

It will be appreciated that whilst all dimensions of the gate region could be different among the transistors of the MOS device assembly 100, it is also possible to make some of them the same. In other words, according to a preferred embodiment of the present disclosure, there are no two transistors which have the same set of thicknesses, widths and lengths. However, the disclosure extends to embodiments where two or more transistors have the same set of thicknesses, widths and lengths, as long as there are at least two transistors which have different sets of thicknesses, widths and lengths.

It will be noted that, in FIG. 2, the source region 107 is located at the centre of the active region 101 and the drain regions 105 are located towards the outside of the active region 101. It is also possible to interchange the positions of the source and drain regions, i.e. the source regions are located towards the outside of the active region 101 and the drain regions are located at the centre of the active region 101. However, it is preferred that the source region 107 is located at the centre. This is because the resistance of the source region 107 is improved, which is the resistance between the edges of the common poly gate structure 102 and the source contact 106. Whilst it is possible to form the gate structure without the "ring" formation shown in FIG. 2, it may be advantageous to use the "ring" formation for the common gate structure 102 as this requires the use of only one gate contact and reduces the gate resistance.

Figure 3:
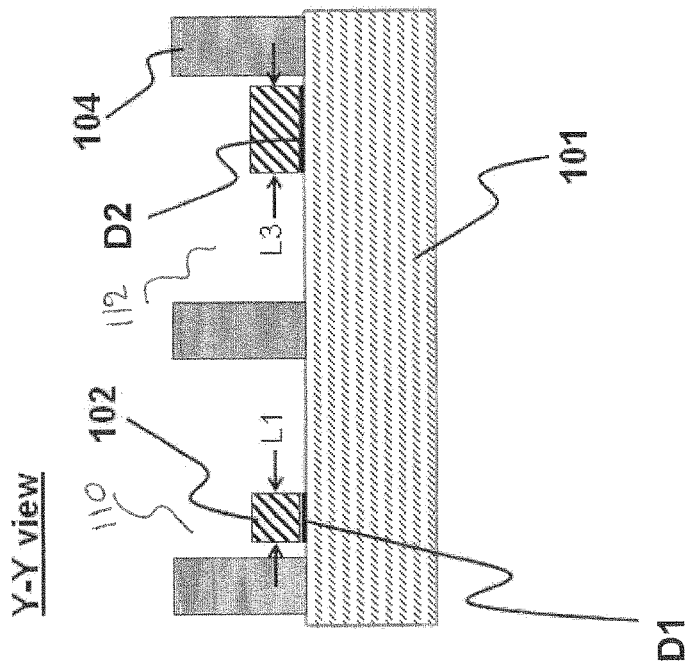
FIG. 3a is a schematic cross section of the MOS device assembly of FIG. 2 across plane X-X.
FIG. 3b is a schematic cross section of the MOS device assembly of FIG. 2 across plane Y-Y.
Figure 3:
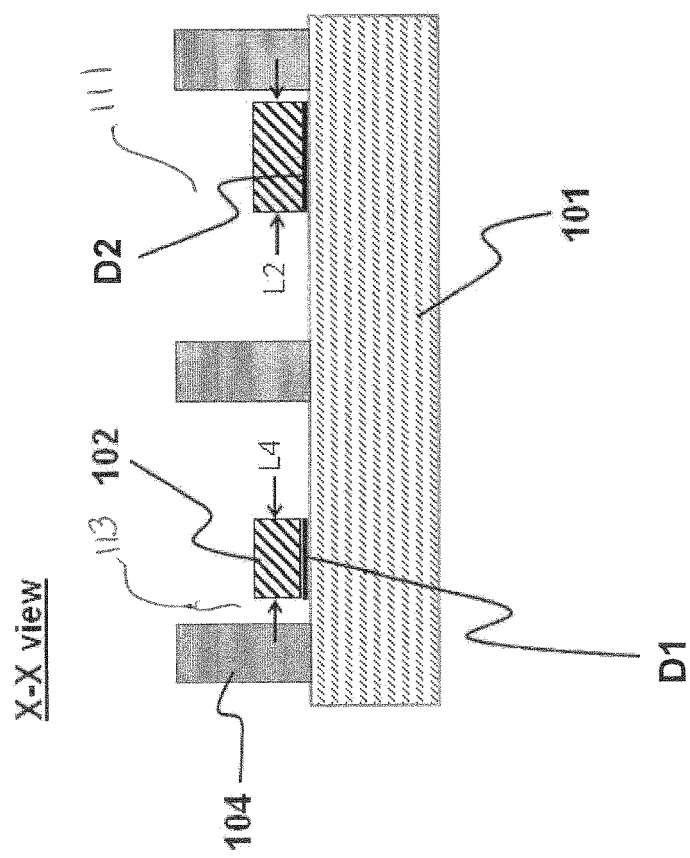

FIG. 3a is a schematic cross section of the MOS device assembly of FIG. 2 across plane X-X. In this arrangement, the second transistor 111 and the fourth transistor 113 are arranged such that the source of these transistors is shared in the middle and the drains of these transistors are separate and aligned opposite each other. The lengths L2, L4 of the poly gates 102 of the second and fourth transistors 111, 113 are different. The thickness D1 of the oxide region of the fourth transistor 113 is different from the thickness D2 of the oxide region of the second transistor 111.

FIG. 3b is a schematic cross section of the MOS device assembly of FIG. 2 across plane Y-Y. Similar to the arrangement of FIG. 3a, the lengths L1, L3 of the poly gates 102 of the first and the third transistors 110, 112 are different. The thickness D1 of the oxide region of the first transistor 110 is different from the oxide region thickness D2 of the third transistor 112.

Figure 4:
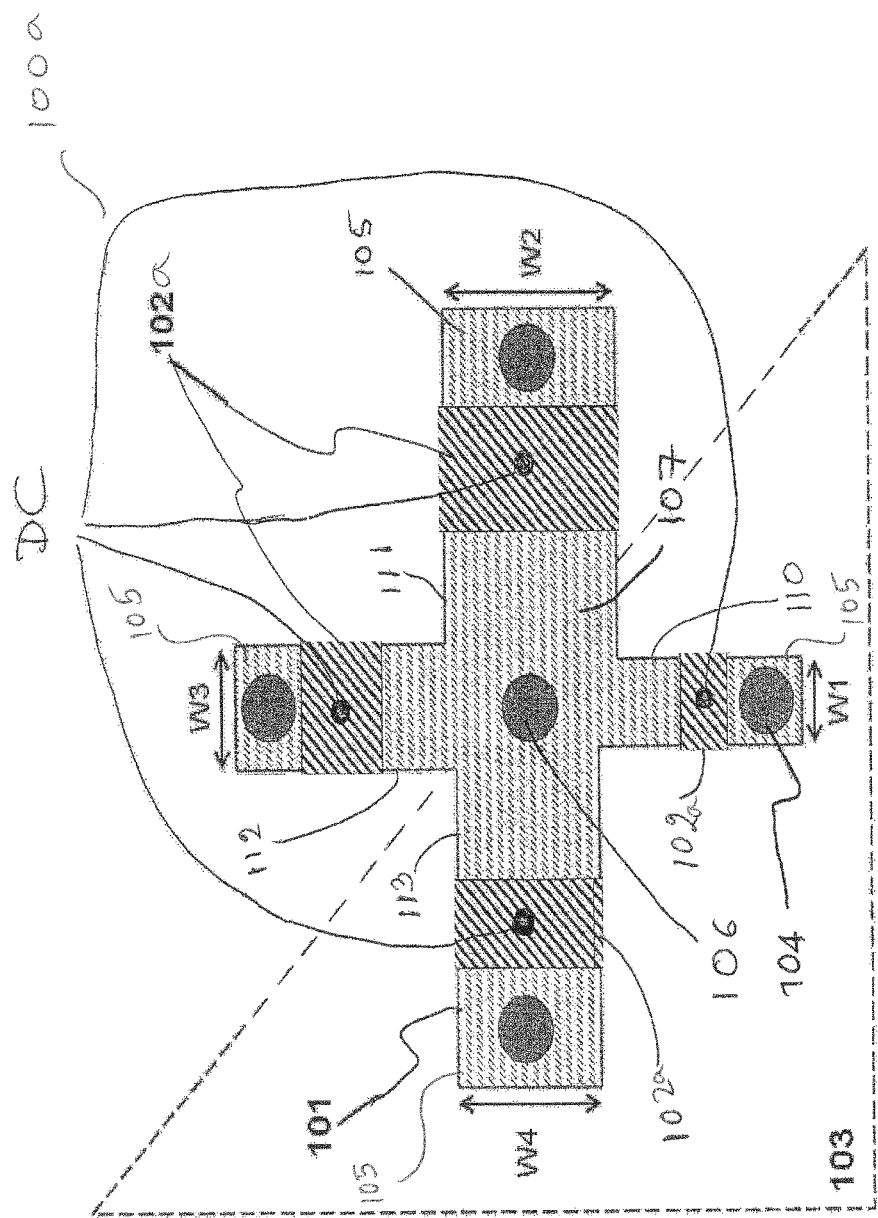
FIG. 4 is a schematic plan view of an alternative MOS device assembly according to an embodiment of the present disclosure.

FIG. 4 is a schematic plan view of an alternative MOS device assembly 100a. Many features are the same as FIG. 2, carry the same reference and have the same or a similar function. However, the device assembly 100a does not have a common gate structure. Each transistor of the device assembly 100a includes a discrete poly gate 102a which is biased using the same DC voltage. Alternatively, it is possible to DC bias the poly gate 102a of each transistor separately but apply the same RF signal to the poly gate 102a of each transistor. "T" circuitry can be used for this biasing arrangement which allows manipulation of the transconductance. The third order derivative of this transconductance performance affects the third order inter-modulation product. It will be noted that the term "inter-modulation product" relates to a measure of linearity. For example, when two input signals are fed into a non-linear system, e.g. an amplifier, additional signals are generated at the output. As the input signal power is increased, the inter-modulation product increases and is extrapolated to a point where the product matches the power of the main output signals. This point is an RF figure of merit.

Figure 5:
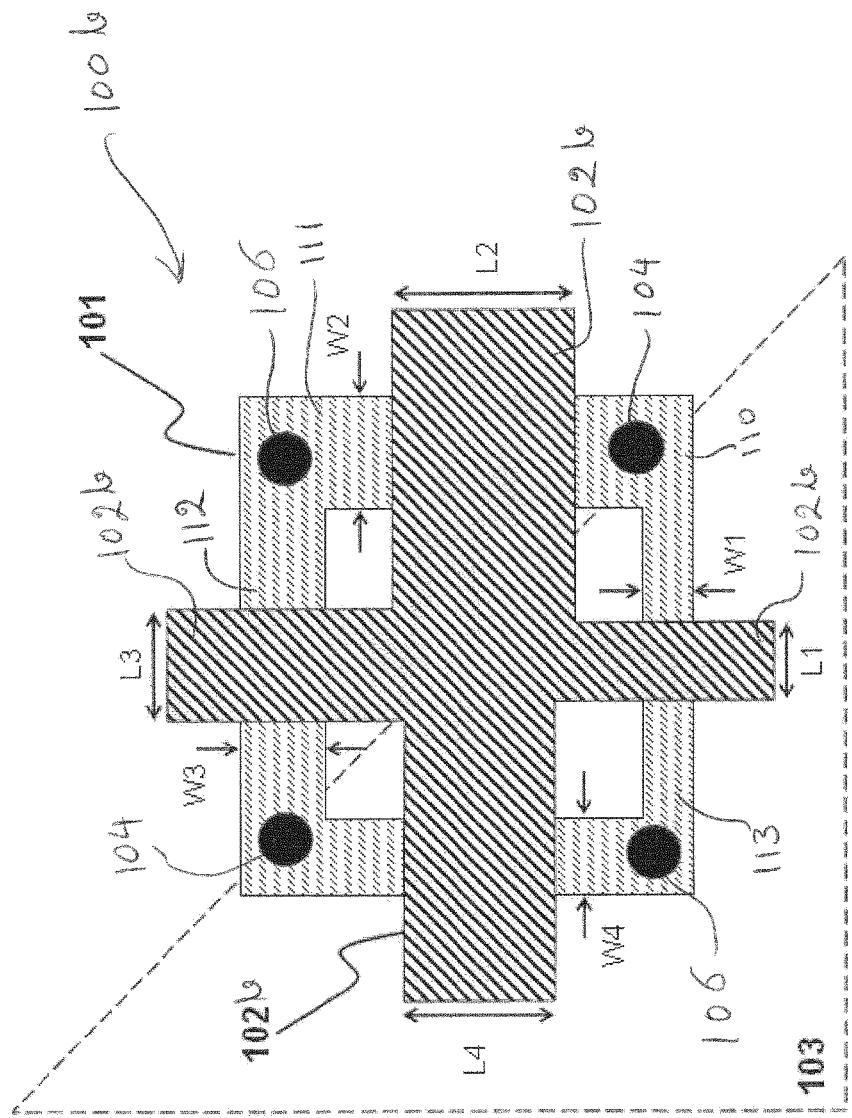
FIG. 5 is a schematic illustration of a plan view of an alternative MOS device assembly according to an embodiment of the present disclosure.

FIG. 5 is a schematic illustration of a plan view of an alternative MOS device assembly 100b. Many features are the same as FIG. 2, carry the same reference and have the same or a similar function. However, the common gate structure 102b has a "cross" shape. Furthermore, the active region 101 has a rectangular shape. The source contacts 106 are located in diagonally opposite corners of the rectangular active region 101. The drain contacts 104 are located in the remaining corners of the rectangular active region 101, which are also diagonally opposite each other. Each of the four transistors of the assembly is formed along one side of the rectangular active region 101 (instead of along each arm of the cross-shaped active region of FIG. 2).

Figure 6:
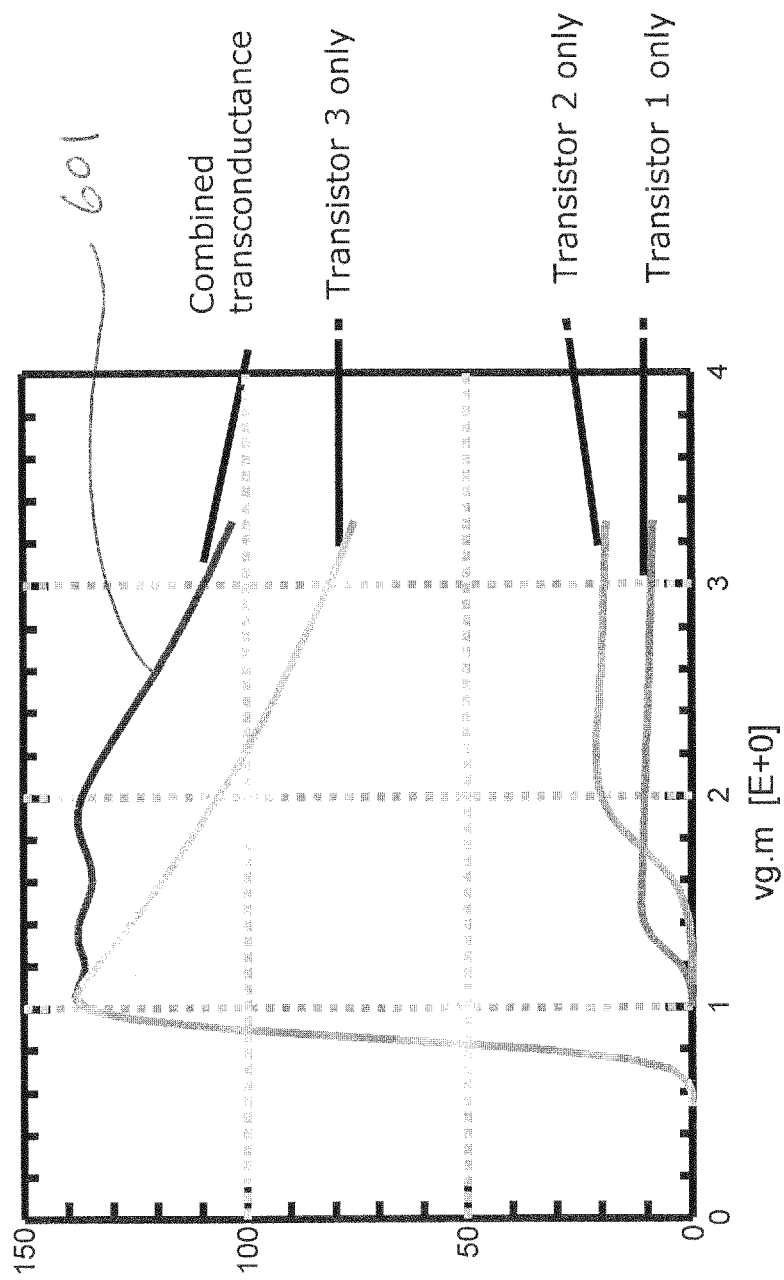
FIG. 6 shows simulated transconductance characteristics over a range of gate voltages according to an embodiment of the present disclosure.

FIG. 6 shows simulated transconductance characteristics over a range of gate voltages according to an embodiment of the present disclosure. These results are for a device assembly comprising three transistors, which operates in the same way as the device assembly having four transistors as described hereinbefore with reference to the present disclosure. In this arrangement the process parameters such as the thickness of the gate oxide region, the width and length of the poly gate and the threshold voltage of each transistor are varied and consequently the transconductance characteristics of the device assembly are also varied. With different threshold voltages for each of the three transistors, the gm peaks are offset. The spacing of the peaks and their magnitude is controllable using these process parameters. Since, in this example, the three transistors can be connected in parallel, the characteristics of each transistor can be combined (added) to achieve the total transconductance characteristics 601 of FIG. 6. In one embodiment, the total transconductance 601 of the MOS device assembly is substantially uniform over a range of gate voltages. For example, the transconductance of the device assembly may be substantially uniform over at least 20% of the range of (suitable) gate voltages. In a further example, the transconductance of the device assembly is substantially uniform over a gate voltage range comparable to the threshold voltage of a transistor of the assembly, for example at least 0.7V. In the FIG. 6 simulation, the transconductance is uniform over a range of about 1V (between 1V and 2V)

Conventional semiconductor fabrication techniques, eg a CMOS technique, can be used to obtain the uniform transconductance MOS device assembly of the present disclosure. The manufacturing processes for the MOS device assembly as shown in FIG. 2 are described below and the reference numerals below correspond to those of FIG. 2.

A pad oxide is formed on a silicon substrate, and a SiN layer is deposited. The active region 101 is then defined by a masking step. The active region isolation is formed by anisotropic etching of the SiN layer, the pad oxide and a certain depth of the wafer substrate which form shallow trench isolation (STI) trenches. The STI trenches are filled with silicon oxide insulating material, and chemical mechanical polishing (CMP) can be used to polish away unwanted silicon oxide above the SiN layer covering the active region 101. Subsequently, the SiN layer and the pad oxide are removed. The active region 101 and the STI isolation are now formed.

After these, a sacrificial thermal oxide layer is grown followed by various masking, well implantation and cleaning steps. The sacrificial thermal oxide layer is then removed by wet clean, and a first thermal gate oxide is grown. For a dual oxide process, a first oxide region having a first oxide thickness, and a second oxide region having a second oxide thickness are formed. A mask 103 is then used to cover the envisaged first oxide region, and this first gate oxide region is removed from the second oxide region by wet clean, and the mask 103 removed. A second thermal gate oxide region is then grown to define the final gate oxide thickness in the first and second oxide regions. The gate oxides are grown by furnace oxidation.

According to a variant, the sacrificial thermal oxide remains in a third gate oxide region using a mask during the wet clean. The first gate oxide region is then grown. A mask 103 is used to cover both the first and third gate oxide regions, and this first gate oxide is removed from the second gate oxide region by wet clean, and then the mask is removed. A third gate oxide is now grown to define the final gate oxide thickness in the first, second and third gate oxide regions. The gate oxides are grown by furnace oxidation.

In another embodiment, a fourth gate oxide region is defined. After the first, second and third gate oxide regions are formed, a mask is used to cover the first, second and third gate oxide regions, and the unwanted gate oxide is removed from the fourth gate oxide region by wet clean. The mask is then removed. The fourth gate oxide is now grown using In-Situ Steam Generation (ISSG) gate oxidation technique, with no thermal or thickness impact on the first, second and third gate oxide regions. Thus, the first, second, third and fourth gate oxide regions are defined.

It will be appreciated that, in the dual or tri oxide processes described above, the sacrificial thermal oxide is fully removed by a blanket wet etch, and then the first thermal oxide is grown from silicon. For a quad oxide process, the fourth gate oxide region is generally masked by a masking step followed by a wet etch to remove the sacrificial thermal oxide from the first, second and third gate oxide regions.

As per the above techniques, multiple gate oxide thicknesses for a uniform transconductance composite transistor can be defined, having a single, dual, three or quad gate oxide regions.

A poly gate is then deposited. Electrodes of the uniform transconductance MOS assembly are then defined by a poly mask, over the active region 101, and unwanted poly material in an open area is etched by anisotropic etching. This is followed by various masking, LDD implantation and cleaning steps.

A poly sidewall is then formed, followed by source/drain implantations, salicidation and metallization using conventional semiconductor fabrication methods.

Embodiments of the present disclosure may provide the following advantages:

1. The MOS device assembly improves the analogue performance. The transconductance and transconductance generation efficiency can be varied for a given bias point. This provides additional degrees of freedom in circuit design.

2. The quadratic design of the transistor facilitates good matching between transistors. In analogue design, it may be required for transistors to be closely matched to each other. This is particularly applicable to current mirrors or differential circuits. Typically, the further away two transistors are from each other on the chip, the worse the correlation between the two. Also, the greater the size, the better the correlation. In the present disclosure, since the optimum design is more compact, the distance between two transistors should be less whilst having the same gate oxide area to achieve a better matching. The distance between two transistors of the MOS device assembly is generally defined by a minimum design rule of a specific technology process. The design rule, for example, can specify minimum distances between various layers, e.g. DIFF, POLY in a semiconductor device. In one example, the distance between two transistors of the MOS device assembly is about 2.0 µm so that the matching between the two transistors is improved. In other embodiments the distance may be more than about 2 µm. In order to achieve improved matching, the quadratic arrangement of the present disclosure may use various design techniques such as a quad coupling as a matching layout technique.

3. Additional benefits may also be achieved by using the square poly gate formation such as reduced gate resistance in RF applications and less gate to drain overlap capacitance.

It will be noted that the foregoing description is generally directed to arrangements having a poly gate. It will be appreciated that the poly gate may comprise poly silicon or any other semiconductor materials.

It will be also noted that the foregoing description is directed to arrangements in which the threshold voltage of each transistor is changed when the gate oxide thickness, poly gate length and width are changed. It will be appreciated that the threshold voltage of each transistor can also be varied by changing the doping profile of the channel area in the active region.

Furthermore, in the arrangements described hereinbefore, the transistors of the MOS device assembly are arranged in a square or cross shaped layout. It will be appreciated that a linear arrangement is also possible, i.e. one in which the transistors are arranged next to each other.

In all arrangements described herein the transistors would normally be connected in parallel.

Although the arrangements described hereinbefore include four transistors in the MOS device assembly, it will be appreciated that the disclosure can be implemented using more than, or less than four transistors. Thus, using four transistors in the MOS device assembly is particularly advantageous.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A MOS device assembly comprising:
at least a first transistor and a second transistor, each of said first and second transistors having a gate and a gate region;
wherein dimensions of the gate or gate region of the first transistor are different from dimensions of the gate or gate region of the second transistor; and
wherein the MOS device assembly is configured to produce a plurality of transconductance peaks over a range of gate voltages so that a sum of the transconductance peaks results in a quasi-plateau having transconductance peaks of magnitudes over the gate voltages when the gates or gate regions of the first and second transistors are biased using the same voltage.

2. A MOS device assembly according to claim 1, wherein the gate or gate region of each of the first and second transistors comprises an oxide region over a semiconductor active region of the MOS device assembly and a poly gate formed on the oxide region.

3. A MOS device assembly according to claim 2, wherein a thickness of the oxide region of each of the first and second transistors is different.

4. A MOS device assembly according to claim 2, wherein a width of the poly gate of each of the first and second transistors is different.

5. A MOS device assembly according to claim 2, wherein a length of the poly gate of each of the first and second transistors is different.

6. A MOS device assembly according to claim 2, wherein a thickness of the oxide region, a length and a width of the poly gate of each of said first and second transistors are different.

7. A MOS device assembly according to claim 1, wherein a threshold voltage of each of the first and second transistors is different.

8. A MOS device assembly according to claim 7, wherein the threshold voltages of each of the first and second transistors are chosen such that the transconductance of the MOS device assembly is quasi-plateaued having transconductance peaks of magnitudes over the range of gate voltages.

9. A MOS device assembly according to claim 8, wherein the transconductance of the device assembly is quasi-plateaued having transconductance peaks of magnitudes over at least 20% of the range of gate voltages.

10. A MOS device assembly according to claim 8, wherein the transconductance of the device assembly is quasi-plateaued having transconductance peaks of magnitudes over a gate voltage range of at least 0.7 V.

11. A MOS device assembly according to claim 1, wherein the MOS device assembly comprises a common gate structure, wherein the gates of each of the first and second transistors form part of the common gate structure.

12. A MOS device assembly according to claim 11, wherein the common gate structure is rectangularly shaped.

13. A MOS device assembly according to claim 11, wherein the common gate structure is substantially cross-shaped.

14. A MOS device assembly according to claim 1, wherein all of the first and second transistors are arranged to be connected in parallel.

15. A MOS device assembly according to claim 1, wherein all of the first and second transistors share a common source formed in a semiconductor active region of the device assembly.

16. A MOS device assembly according to claim 1, wherein all of the first and second transistors are arranged next to each other.

17. A MOS device assembly according to claim 1, wherein the gate of each of the first and second transistors is a discrete gate having a discrete poly gate.

18. A MOS device assembly according to claim 1, wherein the MOS device assembly further includes four transistors.

19. A MOS device assembly comprising:
   at least a first transistor and a second transistor, each of the first and second transistors having a gate and a gate region;
   wherein dimensions of the gate or gate region of the first transistor are different from dimensions of the gate or gate region of the second transistor; and
   wherein the MOS device assembly is configured to produce a plurality of transconductance peaks over a gate voltage range of at least 0.7 V so that a sum of the transconductance peaks results in a quasi-plateau having transconductance peaks of magnitudes over said gate voltage range when the gates or gate regions of the first and second transistors are biased using the same voltage.

20. A MOS device assembly comprising:
   at least a first transistor and a second transistor, each of the first and second transistors having a gate and a gate region;
   wherein dimensions of the gate or gate region of the first transistor are different from dimensions of the gate or gate region of the second transistor, such that, when the gates or gate regions of the first and second transistors are biased using the same voltage, a uniformity of a transconductance of the MOS device assembly having a plurality of transconductance peaks over a predetermined range of gate voltages is greater when compared with a transconductance of the first transistor or the second transistor of the MOS device assembly over said predetermined range of gate voltages.

21. A MOS device assembly according to claim 20, wherein the uniformity of the transconductance of the MOS device assembly is greater when compared with the transconductance of each of said first and second transistors.

22. A MOS device assembly according to claim 20, wherein said predetermined range is at least 0.7 V.

23. A MOS device assembly according to claim 20, wherein the uniformity of the MOS device assembly is greater over a range of gate voltages between 1V and 2V.

24. A method of manufacturing a MOS device assembly having at least a first transistor and a second transistor, the method comprising:
   forming a first gate and a first gate region of the first transistor, and
   forming a second gate and a second gate region of the second transistor, wherein dimensions of the first gate or the first gate region of the first transistor are different from dimensions of the second gate or the second gate region of the second transistor, and wherein the MOS device assembly is configured to produce a plurality of transconductance peaks over a range of gate voltages so that a sum of the transconductance peaks results in a quasi-plateau having transconductance peaks of magnitudes over the gate voltages when the gates or gate regions of the first and second transistors are biased using the same voltage.

25. A method according to claim 24, wherein the gate of each of the first and second transistors further includes an oxide region over a semiconductor active region of the device and a poly gate formed on the oxide region.

26. A method according to claim 25, wherein each of the first gate and the second gate is formed by:
   providing the semiconductor active region having a source and a drain;
   providing a sacrificial thermal oxide region by using masking, well implantation and cleaning;
   removing the sacrificial thermal oxide region by wet cleaning;
   providing a thermal gate oxide region having an oxide thickness; and
   providing a mask to cover the thermal gate oxide region of one of the first and second transistors to remove the thermal gate oxide region of the other one of the first and second transistors.

27. A method according to claim 26, wherein the thermal oxide region of each of the first and second transistors is grown using furnace oxidation.

28. A method according to claim 26, further comprising depositing the poly gate over the thermal gate oxide region.

29. A method according to claim 24, wherein the device assembly is manufactured using a CMOS technique.

30. A method according to claim 24, further comprising controlling the matching between the first and second transistors using a matching layout technique comprising quad coupling.

31. A method of forming a MOS device assembly having at least a first transistor and a second transistor, the method comprising:
   forming a first gate and a first gate region of the first transistor, and
   forming a second gate and a second gate region of the second transistor, wherein dimensions of the first gate or first gate region of the first transistor are different from dimensions of the second gate or second gate region of the second transistor, and
   choosing the dimensions of the first gate or the first gate region and the dimensions of the second gate or the second gate region to produce a plurality of transconductance peaks over a range of gate voltages so that a sum of the transconductance peaks results in a quasi-plateau having transconductance peaks of magnitudes over the gate voltages when the gates or the gate regions of the first and second transistors are biased using the same voltage.

* * * * *